(12) United States Patent
Kudo (10) Patent No.: US 9,406,600 B2
(45) Date of Patent: Aug. 2, 2016

(54) PRINTED CIRCUIT BOARD AND STACKED SEMICONDUCTOR DEVICE

(71) Applicant: CANON KABUSHIKI KAISHA, Tokyo (JP)

(72) Inventor: Hiroyuki Kudo, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/593,346

(22) Filed: Jan. 9, 2015

(65) Prior Publication Data

US 2015/0206832 A1 Jul. 23, 2015

(30) Foreign Application Priority Data

Jan. 21, 2014 (JP) .................................. 2014-008422

(51) Int. Cl.
*H01L 23/495* (2006.01)
*H01L 23/02* (2006.01)
*H01L 23/48* (2006.01)
*H01L 23/52* (2006.01)
*H01L 29/40* (2006.01)
*H01L 23/498* (2006.01)

(52) U.S. Cl.
CPC .... *H01L 23/49838* (2013.01); *H01L 23/49816* (2013.01); *H01L 2924/0002* (2013.01); *H01L 2924/3511* (2013.01)

(58) Field of Classification Search
CPC .................. H01L 23/49838; H01L 23/49816; H01L 2924/0002; H01L 2924/3511; H01L 23/3114

USPC .................................. 257/676, 686, 777, 778
See application file for complete search history.

(56) References Cited

U.S. PATENT DOCUMENTS

| 8,450,856 | B2 * | 5/2013 | Kang ................... H01L 23/3114 257/737 |
| 2003/0070931 | A1 * | 4/2003 | Kitchens .................. B23B 7/08 205/118 |
| 2011/0006433 | A1 * | 1/2011 | Kanetaka .......... H01L 23/49816 257/773 |

FOREIGN PATENT DOCUMENTS

JP 2008-124363 A 5/2008

* cited by examiner

*Primary Examiner* — A. Sefer
*Assistant Examiner* — Dilinh Nguyen
(74) *Attorney, Agent, or Firm* — Fitzpatrick, Cella, Harper & Scinto (57) ABSTRACT

A semiconductor package includes an interposer and a semiconductor element mounted on one surface of the interposer. A plurality of lands are formed on another surface of the interposer. A plurality of lands are formed on a surface of a printed wiring board opposed to the another surface of the interposer. The plurality of lands on the printed wiring board are divided into a first land group including lands connected to the plurality of lands formed on the another surface of the interposer via solder and a second land group including lands connected to an insulating member of the interposer via solder. The second land group is provided in a region opposed to a center region of the another surface of the interposer. The first land group is provided around the second land group so as to surround the second land group.

15 Claims, 8 Drawing Sheets

PRINTED CIRCUIT BOARD AND STACKED SEMICONDUCTOR DEVICE

BACKGROUND OF THE INVENTION

1. Field of the Invention

The present invention relates to a printed circuit board in which an interposer of a semiconductor device and a printed wiring board are soldered to each other, and a stacked semiconductor device in which interposers of semiconductor devices are soldered to each other.

2. Description of the Related Art

In recent years, as electronic equipment achieves greater functionality, a semiconductor package as a semiconductor device is more and more required to have a structure, which can cope with an increase in number of terminals, and is advantageous for miniaturization. As an example of such a semiconductor package, a ball grid array (BGA) type or land grid array (LGA) type semiconductor package is known.

In a semiconductor package of this type, electrodes are arranged utilizing a bottom surface region of an interposer (package substrate). This structure enables securement of a larger number of terminals and reduction in mounting space.

In particular, in an LGA type semiconductor package, a land formed on a semiconductor package and a land formed on a printed wiring board can be joined to each other without using a solder ball. Therefore, a mounting step can be simplified, and a height of the entire semiconductor package after the mounting can be made smaller, which is advantageous in thinning. Accordingly, such an LGA type semiconductor package is expected to be used in various products in the future. In general, a height of an LGA type semiconductor package after the mounting with respect to a printed wiring board is from about 100 µm to about 300 µm.

A manufacturing method of mounting an LGA type semiconductor package on a printed wiring board such as a motherboard or an interposer of another semiconductor package is as follows. Solder paste is printed on a land formed on the printed wiring board. Then, the semiconductor package is mounted on the printed wiring board using a mounting apparatus such as a mounter. After that, the printed wiring board having the semiconductor package mounted thereon is introduced into a reflow furnace to heat and melt the solder paste, thereby electrically connecting a land on the interposer of the semiconductor package and a land formed on the printed wiring board to each other via solder.

In such a manufacturing method of mounting an LGA type semiconductor package on a printed wiring board, the lands are joined together only via the printed solder paste, and thus, it is not necessary to mount a solder ball on the semiconductor package, which enables simplification of the process. Further, the used solder has only a small volume, and thus, the formed solder has only a small height, which is advantageous in thinning.

Ordinarily, in a printed wiring board and a semiconductor package in a reflow step, warpage occurs when heated under the influence of thermal expansion of a wiring pattern stacked therein. In particular, an interposer of a semiconductor package has a semiconductor element mounted thereon having a linear expansion coefficient which is lower than that of the interposer, and thus, warpage is liable to occur in such a manner that a surface opposite to a surface having the semiconductor element mounted thereon bulges.

In an LGA mounting structure, the solder has a small height, and thus, when warpage occurs in the interposer as described above, at a portion where a gap between the interposer of the semiconductor package and the printed wiring board becomes smaller, the solder is flattened more, which makes a bridge more liable to occur. Therefore, in order to prevent a solder bridge, it is necessary to make the solder less liable to be flattened even when warpage occurs in the interposer of the semiconductor package and in the printed wiring board.

In Japanese Patent Application Laid-Open No. 2008-124363, as a method of making solder less liable to be flattened, there is described a technology which uses dummy solder in which a dummy land is formed only on one substrate of an interposer of a semiconductor package and a printed wiring board so that the dummy land is not electrically joined to another substrate.

SUMMARY OF THE INVENTION

According to an aspect of the present invention, there is provided a printed circuit board, including a semiconductor device comprising a semiconductor element and an interposer, the interposer having the semiconductor element mounted on one surface thereof and having a plurality of conductive lands, which are exposed from an insulating member, formed on another surface thereof; and a printed wiring board having a plurality of conductive lands, which are exposed from an insulating member, formed on a surface thereof which is opposed to the another surface of the interposer, wherein the plurality of lands formed on one of the interposer and the printed wiring board comprise a first land group and a second land group, the first land group having solder formed thereon, the solder being connected to the plurality of lands formed on another of the interposer and the printed wiring board, the second land group having solder formed thereon, the solder being in contact with the insulating member of the another of the interposer and the printed wiring board, wherein the plurality of lands forming the second land group are arranged in one of a center region of the another surface of the interposer and a region opposed to the center region, and wherein the plurality of lands forming the first land group are arranged around the second land group so as to surround the second land group.

According to another aspect of the present invention, there is provided a stacked semiconductor device, including a first semiconductor device comprising a first semiconductor element and a first interposer, the first interposer having the first semiconductor element mounted on one surface thereof and having a plurality of conductive lands, which are exposed from an insulating member, formed on another surface thereof; and a second semiconductor device comprising a second semiconductor element and a second interposer, the second interposer having the second semiconductor element mounted on one surface thereof and having a plurality of conductive lands, which are exposed from an insulating member, formed on another surface thereof, wherein the plurality of lands formed on one of the first interposer and the second interposer comprise a first land group and a second land group, the first land group having solder formed thereon, the solder being connected to the plurality of lands formed on another of the first interposer and the second interposer, the second land group having solder formed thereon, the solder being in contact with the insulating member of the another of the first interposer and the second interposer, wherein the plurality of lands forming the second land group are arranged in a center region of the another surface of the one of the first interposer and the second interposer, and wherein the plurality of lands forming the first land group are arranged around the second land group so as to surround the second land group.

Further features of the present invention will become apparent from the following description of exemplary embodiments with reference to the attached drawings.

BRIEF DESCRIPTION OF THE DRAWINGS

The drawings, which are incorporated in and constitute a part of the specification, illustrate exemplary embodiments, features, and aspects of the present invention.

DESCRIPTION OF THE EMBODIMENTS

In a structure described in Japanese Patent Application Laid-Open No. 2008-124363, a land is not formed on the another substrate at a portion corresponding to the dummy solder (dummy land).

When a land is formed, wettability between a surface of the land formed of a conductor such as Cu or Au and molten solder is good, and thus, when a tip of the solder is brought into contact with the surface of the land, the solder spreads on the surface of the land. Therefore, a height of the solder becomes smaller.

On the other hand, a surface of a solder resist where no land is formed has a low wettability with molten solder, and thus, the solder is less liable to spread. Therefore, when the molten solder is brought into contact with the surface of the solder resist, surface tension of the molten solder acts so that a contact area between a tip of the solder and the solder resist becomes the smallest. Therefore, with regard to soldered to a land on only one of the substrates, the height of the solder (distance between the substrates) becomes larger compared with a case in which the solder is joined to lands on both of the substrates.

However, when there is a land to be an electrode in a center region of the interposer, surface tension of the solder for joining the lands together acts so that a distance between the center region of the interposer and a portion of the printed wiring board opposed to the region becomes smaller. This sometimes presses and flattens the dummy solder to be brought into contact with adjacent solder to form a bridge between the dummy solder and the adjacent solder. When the dummy solder is attracted to the adjacent solder to be an electrode in this way, a bridge may be formed between the solder which attracts the dummy solder and another solder adjacent to the solder.

Accordingly, an object of the present invention is to prevent a solder bridge.

Embodiments for carrying out the present invention are described in detail below with reference to the attached drawings.

First Embodiment

Figure 1A:
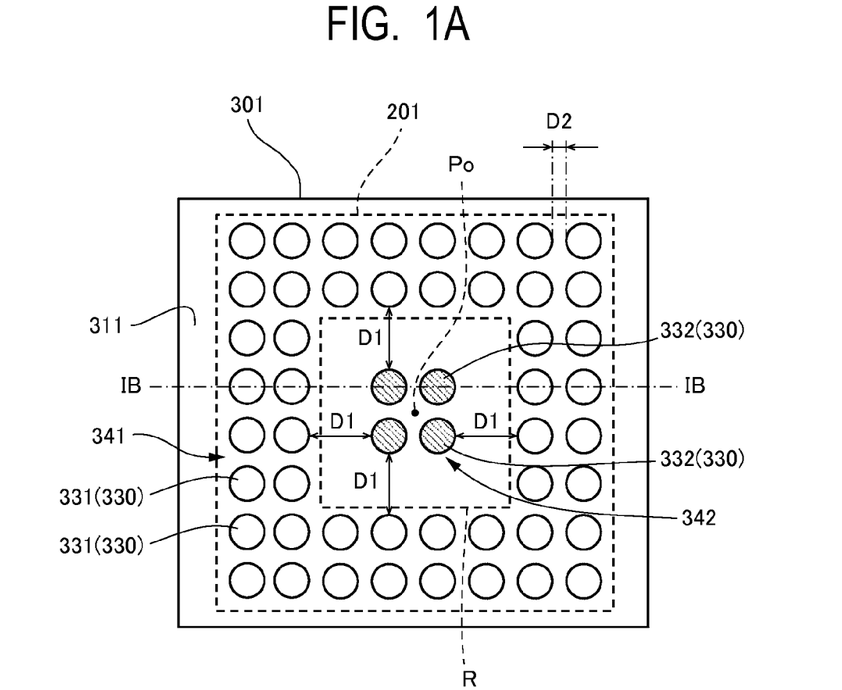
FIGS. 1A and 1B are explanatory diagrams illustrating a schematic structure of a printed circuit board according to a first embodiment of the present invention.
Figure 1B:
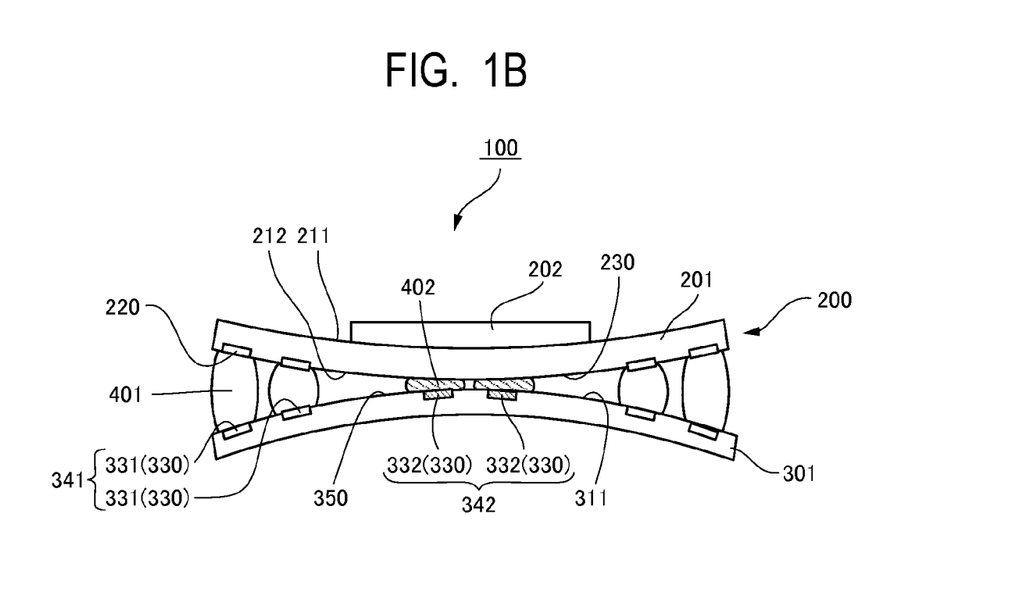

FIGS. 1A and 1B are explanatory diagrams illustrating a schematic structure of a printed circuit board according to a first embodiment of the present invention. FIG. 1A is a plan view illustrating a printed wiring board (motherboard) of the printed circuit board, and FIG. 1B is a sectional view illustrating the printed circuit board taken along the line IB-IB of FIG. 1A.

As illustrated in FIG. 1B, a printed circuit board 100 includes a semiconductor package 200 as a semiconductor device and a printed wiring board (motherboard) 301 having the semiconductor package 200 mounted thereon.

The semiconductor package 200 is an LGA type semiconductor package. The semiconductor package 200 includes an interposer (package substrate) 201 and a semiconductor element (semiconductor chip) 202 mounted on one surface 211 of the interposer 201.

As the interposer 201 and the printed wiring board 301, in addition to an organic substrate such as a multilayer wiring board formed of a glass epoxy material such as FR-4 and a flexible substrate, an inorganic substrate such as a ceramic substrate, a glass substrate, and a silicon substrate may be used. In the first embodiment, a multilayer wiring board formed of a glass epoxy material is used as the printed wiring board 301, and a ceramic substrate is used as the interposer 201 of the semiconductor package 200.

A size of the semiconductor package 200 (interposer 201) is not specifically limited, and may be a large size, which is more liable to be influenced by warpage. For example, a package having outer dimensions of 30 [mm]×30 [mm] or larger may be used.

The semiconductor element 202 is encapsulated with an encapsulating member (not shown). As the encapsulating member, in addition to mold encapsulation and underfilling that use an epoxy resin, glass encapsulation in which airtight space is formed at a portion where the semiconductor element 202 is mounted, and a wafer level package may be used.

A plurality of conductive lands 220 are formed at regular intervals in the shape of a lattice on another surface 212 opposite to the one surface 211 of the interposer 201. In the first embodiment, the plurality of lands 220 are formed at regular intervals so as to have a distance D2 therebetween in the shape of a lattice to surround a predetermined region (center region, inner region) R having a center at a center point $P_o$ of the another surface 212 (FIG. 1A), in other words, in an outer region with respect to the predetermined region R. Therefore, no land is formed in the predetermined region R of the interposer 201.

In the printed wiring board 301, a plurality of conductive lands 330 are formed so as to be apart from one another on a surface (opposed surface) 311 opposed to the surface 212 of the interposer 201.

In this case, a protective layer formed of an insulating member 230 for preventing adhesion of unnecessary solder is formed on the surface 212 around the lands 220 in a state of having openings so that at least a part of a surface of a conductor pattern forming the lands 220 is exposed. Similarly, a protective layer formed of an insulating member 350 for preventing adhesion of unnecessary solder is formed on the surface 311 around the lands 330 in a state of having openings so that at least a part of a surface of a conductor pattern forming the lands 330 is exposed. Shapes of those openings define contours of the lands 220 and 330. Those insulating members 230 and 350 have a lower wettability with the solder than those of the lands 220 and 330.

In the printed wiring board 301, as the insulating member 350, a solder resist formed of, for example, a resin having a thickness of 30 [μm] is used. In the interposer 201 of the semiconductor package 200, as the insulating member 230, a solder resist formed of, for example, an alumina coat having a thickness of 5 [μm] is used. Shapes of the lands 220 and 330 (shapes of the openings) are not specifically limited, and may have an identical size or different sizes. In the first embodiment, both the lands 220 and 330 are in the shape of a circle having a diameter of 1.0 [mm].

In the first embodiment, one substrate of the interposer 201 and the printed wiring board 301 is the printed wiring board 301 and another substrate is the interposer 201.

The plurality of lands 330 formed on the printed wiring board 301 as the one substrate have an electrode land group (first land group) 341 connected to the lands 220 formed on the interposer 201 via solder (electrode solder) 401. Specifically, a plurality of lands (electrode lands) 331 forming the electrode land group 341 are arranged at the same regular intervals as those of the lands 220 in the shape of a lattice so as to have a distance D2 therebetween. Electrode solder 401 is joined to the electrode lands 331 and the lands 220 to electrically and mechanically connect the electrode lands 331 and the lands 220, respectively.

Further, the plurality of lands 330 have a dummy land group (second land group) 342 connected to the insulating member 230 of the interposer 201 via solder (dummy solder) 402. Specifically, a plurality of lands (dummy lands) 332 forming the dummy land group 342 are joined to the dummy solder 402, but the dummy lands 332 are in a state of being electrically insulated from the lands 220. The dummy solder 402 is in a state of being in contact with the insulating member 230, but the dummy solder 402 is not provided for the purpose of electrical connection but is provided as pillar members for maintaining a gap between the substrates.

Therefore, the electrode lands 331 are lands which function as a part of signal transmission paths or power transmission paths, that is, as electrodes. On the other hand, the dummy lands 332 are neither signal transmission paths nor power transmission paths, and are dummy lands without an electrical function used only for junction of the dummy solder 402 for maintaining a gap between the substrates 201 and 301.

The dummy lands 332 are arranged at portions corresponding to the predetermined region R having the center at the center point $P_o$ of the interposer 201, and, in the first embodiment, are arranged in a region of the opposed surface 311 of the printed wiring board 301 opposed to the predetermined region R of the interposer 201. The electrode lands 331 are arranged around the dummy land group 342 so as to surround the dummy land group 342. The dummy lands 332 are arranged at regular intervals in the shape of a lattice.

In other words, in a region between the surface 212 of the interposer 201 of the semiconductor package 200 and the surface 311 of the printed wiring board 301, only the electrode solder 401 is provided in an outer region and only dummy solder 402 is provided in an inner region.

The number of the dummy lands 332 (dummy solder 402) arranged is not specifically limited insofar as desired electrode lands 331 (electrode solder 401) can be arranged in the outer region, but is at least four. In the first embodiment, the number of the dummy lands 332 is four.

As the solders 401 and 402, lead solder or lead-free solder (for example, SnBi-based solder or SnAgCu-based solder) can be used. As the lands 220 and 330, for example, when an organic substrate is used as the interposer 201 and the printed wiring board 301, Cu is used, but Ni plating and Au plating may be further formed on an upper surface of Cu. Further, when a ceramic substrate is used as the interposer 201 and the printed wiring board 301, the lands 220 and 330 may be formed by, after forming a metalized layer formed of tungsten, stacking Ni plating and Au plating in this order. The material is not limited to the above, and other materials may be used for forming the lands insofar as such materials can be joined to solder by removing a surface oxide.

The lands 220 and the electrode lands 331 are arranged at a pitch (distance D2) of, for example, 0.5 [mm]. It is preferred that a distance D1 between an innermost electrode land 331 and an outermost dummy land 332, that is, a distance D1 between the electrode land 331 and the dummy land 332 adjacent to the electrode land 331 be larger than the distance D2. In the first embodiment, the distance D1 is 1.0 [mm].

A distance between adjacent dummy lands 332 is not specifically limited, and may be larger than the distance D2 between the electrode lands 331 in accordance with the extent of flattening of the dummy solder 402 caused by warpage of the interposer 201 and the printed wiring board 301. In the first embodiment, the distance is 0.5 [mm] that is the same as the distance D2.

Next, a method of manufacturing the printed circuit board 100 including the semiconductor package 200 according to the first embodiment is described.

First, solder paste is printed using a printer (not shown) on the electrode lands 331 and the dummy lands 332 which are formed of Cu on the printed wiring board 301. As the solder paste, a mixture of SnBi-based solder particles having a melting point of about 140[° C.] and flux is used.

An amount of supply of the solder paste is roughly determined based on a volume of a mask opening in a printing plate, and thus, can be changed based on a size of the opening and a thickness of the printing plate.

An amount of supply of the solder paste may be changed between the electrode solder 401 and the dummy solder 402. In the first embodiment, with regard to both the electrode solder 401 and the dummy solder 402, the mask opening has a diameter of 1.0 [mm] which is the same as the diameter of the lands, and the printing plate has a thickness of 0.3 [mm].

Next, the semiconductor package 200 is mounted on the surface 311 of the printed wiring board 301 using a mounting apparatus such as a mounter. Specifically, a suction head of the mounting apparatus picks up the semiconductor package 200. After positioning is carried out using a camera, the semiconductor package 200 is mounted on the solder paste which is printed in advance on the printed wiring board 301.

The lands 220 are formed on the surface (bottom surface) 212 of the interposer 201 only at respective portions opposed to the electrode lands 331 formed on the printed wiring board 301. Therefore, the lands 220 formed on the interposer 201 are brought into contact with the solder paste on the electrode lands 331.

After that, the printed wiring board 301 having the semiconductor package 200 mounted thereon is introduced into a reflow furnace. By heating the solder paste in the reflow furnace at a temperature of a melting point of the solder or higher, the solder particles are molten to electrically connect the lands 220 formed on the interposer 201 and the electrode lands 331 formed on the printed wiring board 301 via the solder 401.

By carrying out this reflow heating, warpage occurs in the interposer 201 of the semiconductor package 200 and in the printed wiring board 301. As illustrated in FIG. 1B, the interposer 201 has the semiconductor element 202 mounted on one surface 211 thereof having a linear expansion coefficient which is lower than that of the interposer 201, and thus, warpage occurs in such a manner that the another surface 212 bulges, that is, the interposer 201 bulges downward. With regard to the printed wiring board 301, warpage occurs in such a manner that the printed wiring board 301 bulges upward. Therefore, a vertical gap between the two substrates at the center is smaller than that at an end portion by from about 50 to about 100 [μm].

In this case, a height of the dummy solder 402 at the center is determined based on, in addition to the influence of the warpage described above, weight of the package, an amount of the solder, areas of the lands, and the like. In the first embodiment, the height of the dummy solder 402 at the center is approximately 100 [μm] or less.

Spreading of the molten solder of the dummy solder 402 which is not the electrode solder 401 is inhibited compared with the molten solder between the lands 220 and 331 due to contact of the molten solder on the dummy lands 332 with the insulating member 230 in manufacturing. The dummy lands 332 on the printed wiring board 301 are formed in the region opposed to the predetermined region R having the center at the center point $P_o$ of the interposer 201, and this region has no electrode lands 331.

Specifically, when the vertical gap at the center becomes smaller than that of a peripheral portion due to warpage, the dummy solder 402 is concentratedly arranged on an inner side with respect to the electrode solder 401, and thus, force is likely to act so as to increase the gap between the interposer 201 and the printed wiring board 301. Therefore, the dummy solder 402 on the dummy lands 332 can maintain the gap between the substrates to prevent a bridge between the dummy solder 402 and the electrode solder 401 and a bridge in the electrode solders 401.

By the way, an amount of the solder paste is set so that, when the solder is molten under a state in which the semiconductor package 200 is not mounted thereon, a height thereof is approximately 200 [μm] which is twice as large as the solder paste between the substrates at the center. Therefore, the dummy solder 402 arranged at the center is pressed to be flattened to about half the height, and thus, attempts to protrude from the dummy lands 332 to spread out.

The molten solder which is vertically pressed to be flattened is pushed out in a direction in which a load due to external pressure becomes smaller, and thus, attempts to spread in a direction toward a portion at which the gap between the interposer 201 and the printed wiring board 301 is larger. Specifically, the flattened molten solder tends to spread from the center at which the vertical gap between the interposer 201 and the printed wiring board 301 is smaller due to the warpage thereof toward a peripheral portion at which the vertical gap is larger.

Therefore, in the first embodiment, the distance D1 between an innermost electrode land 331 of the electrode land group 341 and an outermost dummy land 332 of the dummy land group 342 is set to be larger than the distance D2 between two adjacent electrode lands 331 and 331.

This can prevent contact of the molten solder to be the dummy solder 402 with the electrode solder 401 adjacent thereto even when the molten solder to be the dummy solder 402 are flattened in manufacturing to spread out in the direction toward a peripheral portion of the interposer 201, because the distance D1 is provided. This can prevent the molten solder of the dummy solder 402 from flowing out toward the electrode solder 401, and can prevent a bridge in the electrode solders 401.

Note that, the distance D1 between the electrode land 331 and the dummy land 332 can be appropriately changed depending on the extent of the protrusion of the dummy solder 402. For example, when the extent of the warpage of the printed wiring board 301 is small and the amount of protrusion of the dummy solder 402 is small, the distance D1 may be smaller. On the other hand, when the extent of the warpage is large, the distance D1 may be larger. By selectively changing the distance D1 in this way, the number of the electrode lands 331 or the dummy lands 332 to be arranged can be increased.

Increase in the number of the electrode lands 331 brings about an advantageous effect for a trend toward multi-pin. Further, by increasing the number of the dummy lands 332, the effect of increasing the gap between the interposer 201 and the printed wiring board 301 is enhanced, and thus, a bridge in the electrode solders 401 can be prevented with further reliability.

As described above, even if the dummy solder 402 is flattened, a bridge in the electrode solders 401 can be prevented, and thus, a large-sized semiconductor package in which the influence of the warpage of the interposer 201 is considerable can be used. Further, when a small-sized semiconductor package is used to carry out LGA mounting, the amount of the solder to be used can be reduced, and thus, the lands can be arranged at a reduced pitch. Therefore, a mounting structure which is advantageous for a trend toward multi-pin can be obtained.

Note that, by setting the size (area) of the dummy land 332 to be smaller than that of the electrode land 331, when the same amount of the solder paste is printed, the height of the dummy solder 402 can be increased. This can increase the gap between the interposer 201 and the printed wiring board 301, and thus, a bridge in the electrode solders 401 can be further reduced.

Further, the insulating member 230 is a solder resist, and thus, in the interposer 201, a surface level of the solder resist is higher than a surface level of the lands. Therefore, the dummy solder 402 is brought into contact with the insulating member 230 at a portion higher than the lands 220 formed on the interposer 201 by a thickness of the solder resist, which brings about an effect of further increasing the gap between the interposer 201 and the printed wiring board 301.

At this time, the smallest gap between the interposer 201 and the printed wiring board 301 is smaller than 300 μm.

Second Embodiment

Figure 2A:
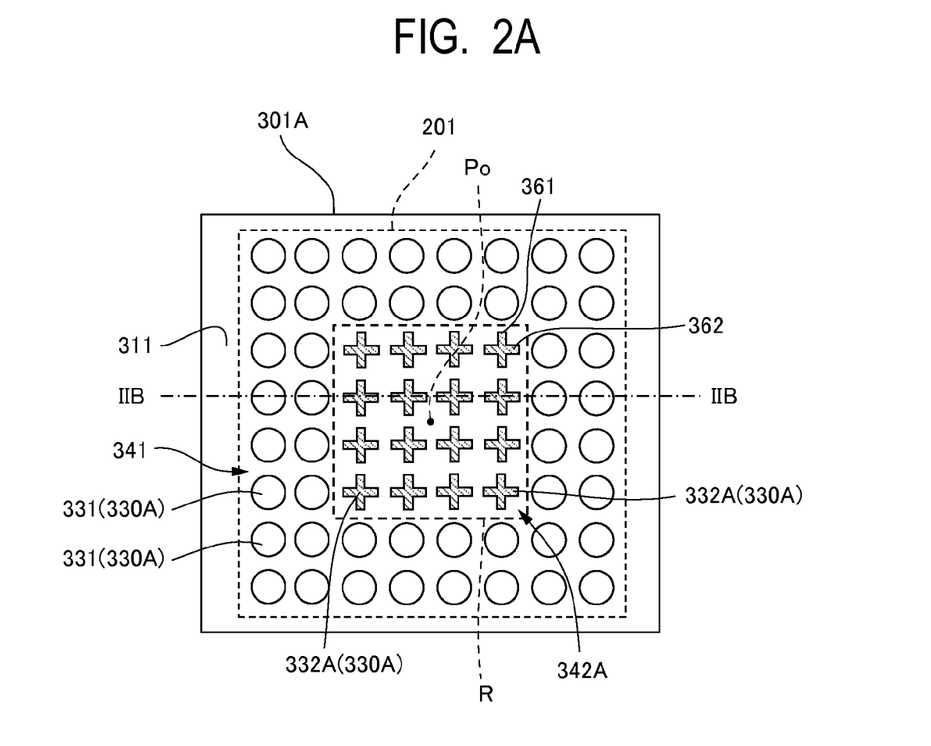
FIGS. 2A and 2B are explanatory diagrams illustrating a schematic structure of a printed circuit board according to a second embodiment of the present invention.
Figure 2B:
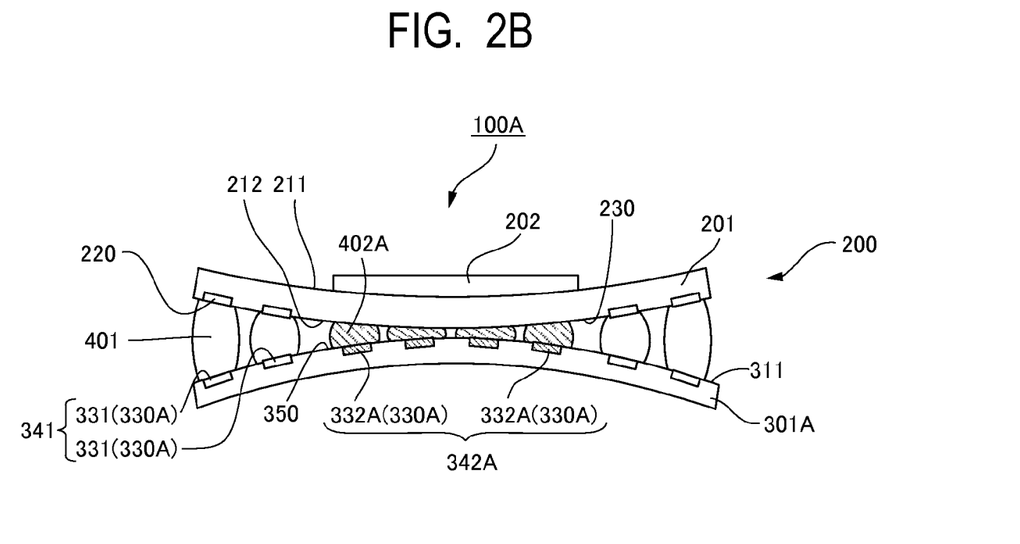

Next, a printed circuit board according to a second embodiment of the present invention is described. FIGS. 2A and 2B are explanatory diagrams illustrating a schematic structure of a printed circuit board according to the second embodiment of the present invention. FIG. 2A is a plan view illustrating a printed wiring board (motherboard) of the printed circuit board, and FIG. 2B is a sectional view illustrating the printed circuit board taken along the line IIB-IIB of FIG. 2A. Note that, in a printed circuit board 100A of the second embodiment, like reference symbols are used to designate like elements in the printed circuit board 100 of the first embodiment described above, and detailed description thereof is omitted.

The printed circuit board 100A includes the semiconductor package 200 which is a semiconductor device similar to that of the first embodiment described above, and a printed wiring board (motherboard) 301A having the semiconductor package 200 mounted thereon which is different from the printed wiring board 301 in the first embodiment described above.

In the printed wiring board 301A, a plurality of conductive lands 330A are formed so as to be apart from one another on the surface (opposed surface) 311 opposed to the surface 212 of the interposer 201. Similarly to the case of the first embodiment described above, the protective layer formed of the insulating member 350 is formed on the surface 311 around the lands 330A in a state of having openings so that at least a part of a surface of the lands 330A is exposed. Shapes of the openings define contours of the lands 330A.

In the second embodiment, one substrate of the interposer 201 and the printed wiring board 301A is the printed wiring board 301A and another substrate is the interposer 201.

The plurality of lands 330A formed on the printed wiring board 301A as the one substrate have an electrode land group (first land group) 341 connected to the lands 220 formed on the interposer 201 via solder (electrode solder) 401 similarly to the case of the first embodiment described above. Specifically, the plurality of lands (electrode lands) 331 forming the electrode land group 341 are arranged at the same regular intervals as those of the lands 220 in the shape of a lattice so as to have a distance therebetween. Electrode solder 401 is joined to the electrode lands 331 and the lands 220 to electrically and mechanically connect the electrode lands 331 and the lands 220, respectively.

Further, the plurality of lands 330A have a dummy land group (second land group) 342A connected to the insulating member 230 of the interposer 201 via solder (dummy solder) 402A. Specifically, a plurality of lands (dummy lands) 332A forming the dummy land group 342A are joined to the dummy solder 402A, but the dummy lands 332A are in a state of being electrically insulated from the lands 220.

The dummy lands 332A are arranged at portions corresponding to the predetermined region R having the center at the center point $P_o$ of the interposer 201, and, in the second embodiment, are arranged in a region of the opposed surface 311 of the printed wiring board 301A opposed to the predetermined region R of the interposer 201. The electrode lands 331 are arranged around the dummy land group 342A so as to surround the dummy land group 342A. The dummy lands 332A are arranged at regular intervals in the shape of a lattice.

In other words, as a method of arranging the electrode solder 401 and the dummy solder 402A, in a region between the surface 212 of the interposer 201 of the semiconductor package 200 and the surface 311 of the printed wiring board 301A, only the electrode solder 401 is provided in an outer region and only dummy solder 402A is provided in an inner region.

In the second embodiment, a shape of the dummy lands 332A is different from that of the dummy lands 332 in the first embodiment described above. At least outermost dummy lands of the entire dummy lands 332A, in the second embodiment, all the dummy lands 332A have a linearly extending rectangular conductor portion 361 and a linearly extending rectangular conductor portion 362 which intersects the conductor portion 361. In the second embodiment, the conductor portion 361 as a first conductor portion and the conductor portion 362 as a second conductor portion are orthogonal to each other so as to form a cross shape. In the second embodiment, the cross shape is formed so that a center of the conductor portion 361 matches a center of the conductor portion 362.

While the electrode lands 331 have a diameter of 1.0 [mm], the dummy lands 332A have outer dimensions of, for example, 1.0 [mm]×1.0 [mm], and widths of the linear conductor portions 361 and 362 which intersect at the respective centers are 0.3 [mm].

The dummy lands 332A are arranged in, for example, four rows and four columns inside a region in which the electrode lands 331 are arranged. Specifically, the number of the dummy lands 332A (dummy solder 402A) is not specifically limited insofar as desired electrode lands 331 (electrode solder 401) can be arranged in the outer region, but is at least four. In the second embodiment, the number of the dummy lands 332A is sixteen.

A distance between the electrode lands 331 and the dummy lands 332A may be the same as a distance between adjacent electrode lands 331, and, in the second embodiment, is 0.5 [mm] which is the same as the distance between adjacent electrode lands 331.

A distance between adjacent dummy lands 332A is not specifically limited, and may be larger than the distance between the electrode lands 331 in accordance with the extent of flattening of the dummy solder 402A. In the second embodiment, the distance between adjacent dummy lands 332A is 0.5 [mm] which is the same as the distance between adjacent electrode lands 331.

The dummy solder 402A joined to the dummy lands 332A may have the same volume as that of the electrode solder 401 and may have a different volume as necessary.

As a method of supplying the dummy solder 402A, solder paste is printed, which is described in the first embodiment. In this case, a diameter of an opening in the printing plate for the dummy land 332A is 1.0 [mm], and the electrode solder 401 and the dummy solder 402A have the same volume.

According to the second embodiment, the dummy lands 332A have such a shape that the rectangular conductor portion 361 and the rectangular conductor portion 362 intersect each other, specifically, in the shape of a cross. Thus, compared with a case in which the dummy lands are in the shape of a circle, the dummy solder 402A is less liable to protrude. Specifically, when the solder is heated and molten, even if warpage similar to that in the first embodiment described above occurs in the interposer 201 and the printed wiring board 301A, the dummy solder 402A is less liable to be flattened, and thus, occurrence of a bridge can be reduced.

Further, the dummy solder 402A is less liable to protrude, and thus, a distance may not be secured between the electrode lands 331 and the dummy lands 332A more than necessary, which enables increase in the number of the electrode lands 331 or the dummy lands 332A to be arranged.

When the extent of the protrusion of the dummy solder 402A is large due to the influence of the warpage of the interposer 201 or the printed wiring board 301A, the distance between an electrode land 331 and a dummy land 332A is set to be larger than the distance between adjacent electrode lands 331. This can effectively prevent a bridge between electrode lands 331.

Further, by forming the dummy lands 332A in the shape of a cross, even when the distance therebetween is the same as that when the dummy lands are in the shape of a circle, an area occupied by the dummy lands 332A can be reduced. This enables, when the same amount of the solder paste as that for the electrode lands 331 is supplied, the dummy solder 402A to be formed is higher than that in the shape of a circle. This can further increase the gap between the interposer 201 and the printed wiring board 301A, which enables more effective prevention of a solder bridge.

Third Embodiment

Figure 3:
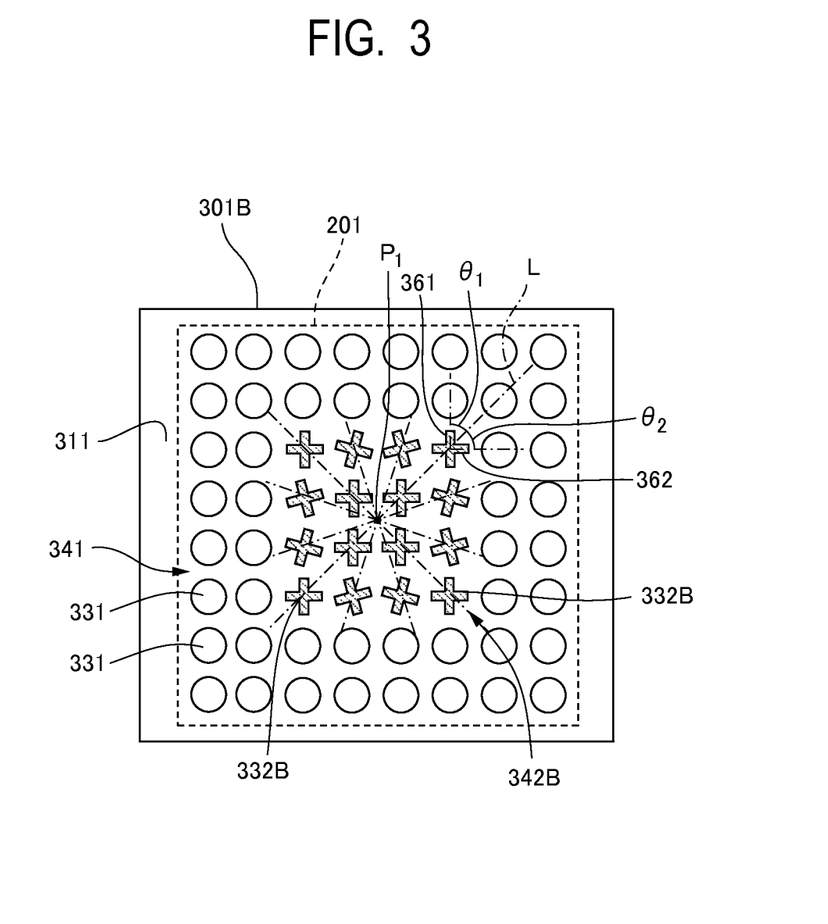
FIG. 3 is a plan view illustrating a printed wiring board of a printed circuit board according to a third embodiment of the present invention.

Next, a printed circuit board according to a third embodiment of the present invention is described. FIG. 3 is a plan view illustrating a printed wiring board of a printed circuit board according to the third embodiment of the present invention. Note that, in the printed circuit board according to the third embodiment, a structure of a printed wiring board 301B, specifically, a structure of dummy lands 332B of a dummy land group 342B is different from that in the printed circuit board 100A according to the second embodiment described above. Note that, in the third embodiment, like reference symbols are used to designate like elements in the first and second embodiments described above, and detailed description thereof is omitted.

In the third embodiment, as illustrated in FIG. 3, the dummy lands 332B are formed by being rotated about respective center points of the dummy lands 332B depending on their arranged portions.

The dummy lands 332B are formed in such a manner that at least one, in the third embodiment, both of the conductor portions 361 and 362 extend so as to intersect imaginary lines L, respectively, which extend radially from a center point $P_1$ of the dummy land group 342B. In other words, the conductor portions 361 and 362 intersect the imaginary lines L, respectively. Those imaginary lines L are straight lines which pass through the center point of the dummy lands 332B, respectively.

In the third embodiment, an angle $\theta_1$ between the imaginary line L and a straight line representing a direction in which the conductor portion 361 extends is 45°, and an angle $\theta_2$ between the imaginary line L and a straight line representing a direction in which the conductor portion 362 extends is 45°.

In this case, the center point $P_1$ of the dummy land group 342B on the printed wiring board 301B is a point opposed to the center point $P_o$ of the interposer 201 (see, for example, FIG. 2A).

By arranging at least one, in the third embodiment, both of the conductor portions 361 and 362 so as to intersect the imaginary line L, a flow of the dummy solder formed on the dummy lands 332B in a radial direction (direction toward the periphery) can be effectively inhibited. In other words, similarly to the case of the first embodiment, even if the vertical gap between the interposer 201 and the printed wiring board 301B at the center becomes smaller due to the warpage of the interposer 201 and the printed wiring board 301B, protrusion of the dummy solder can be inhibited more effectively.

Further, even if a substrate having a large amount of warpage is used, the LGA type semiconductor package 200 can be mounted on the printed wiring board 301B with a high yield. Thus, costs can be reduced.

Figure 4A:
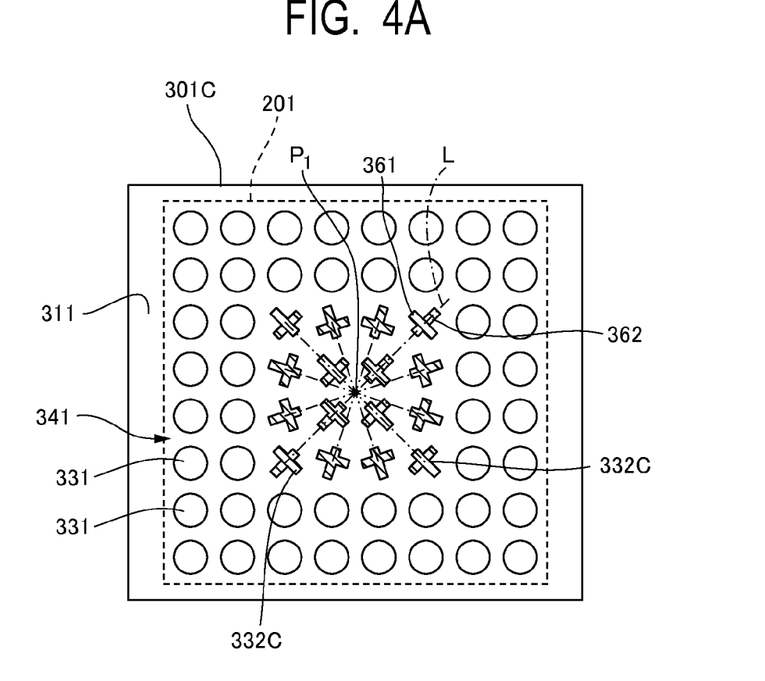
FIGS. 4A and 4B are plan views illustrating modifications of the printed wiring board of the printed circuit board according to the third embodiment.
Figure 4B:
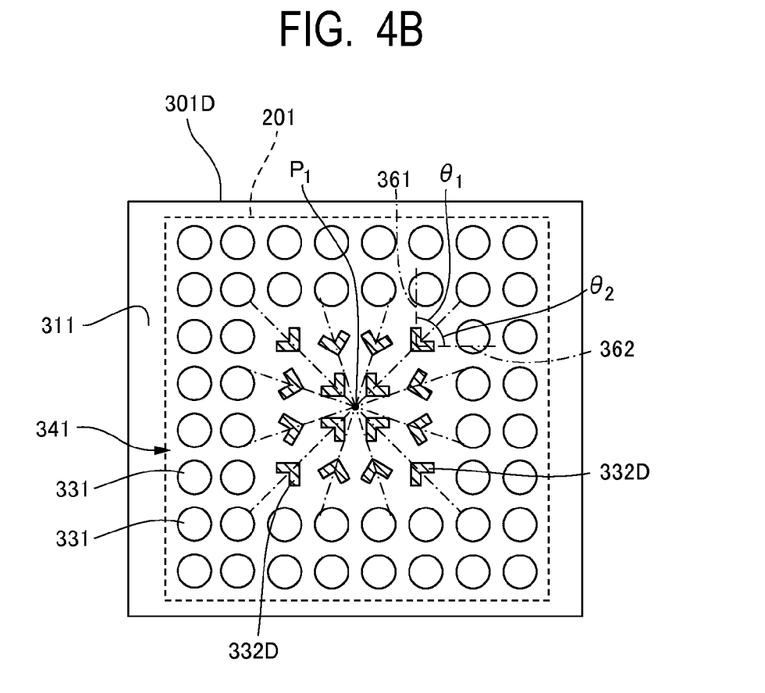

FIGS. 4A and 4B are plan views illustrating modifications of the printed wiring board according to the third embodiment. FIGS. 4A and 4B illustrate printed wiring boards 301C and 301D, respectively, as separate modifications. Note that, the semiconductor device has a similar structure as that in the case of the first embodiment described above.

As illustrated in FIG. 4A, the conductor portion 361 of a dummy land 332C in the shape of a cross may intersect (be orthogonal to) the imaginary line L, and the conductor portion 362 may be formed along the imaginary line L. At that time, as illustrated in FIG. 4A, the center point of the conductor portion 361 may not necessarily match the center point of the conductor portion 362.

Further, a shape of the dummy lands 332D is not limited to a cross, and the conductor portion 361 and the conductor portion 362 may be V-shaped so as to be open in the radial direction (direction toward the periphery) as illustrated in FIG. 4B. At that time, it is preferred that the angle $\theta_1$ between a straight line representing a direction in which the conductor portion 361 extends and the imaginary line L, and the angle $\theta_2$ between a straight line representing a direction in which the conductor portion 362 extends and the imaginary line L be 45°, respectively.

In either of the cases, a solder bridge can be prevented more effectively.

Fourth Embodiment

Figure 5:
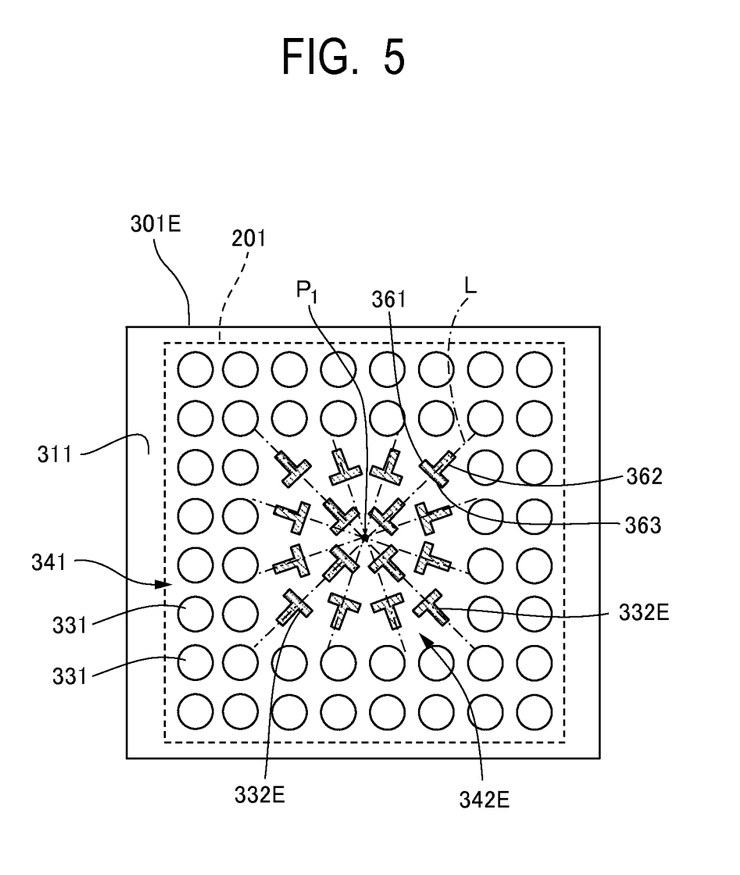
FIG. 5 is a plan view illustrating a printed wiring board of a printed circuit board according to a fourth embodiment of the present invention.

Next, a printed circuit board according to a fourth embodiment of the present invention is described. FIG. 5 is a plan view illustrating a printed wiring board of a printed circuit board according to the fourth embodiment of the present invention. Note that, in the printed circuit board according to the fourth embodiment, a shape of dummy lands on the printed wiring board is different from the shapes of the dummy lands on the printed circuit boards according to the second and third embodiments described above. Other elements in the structure are similar, and thus, like reference symbols are used to designate such like elements and detailed description thereof is omitted.

A dummy land group 342E formed of a plurality of dummy lands 332E is formed on a printed wiring board 301E. At least outermost dummy lands of the entire dummy lands 332E, in the fourth embodiment, all the dummy lands 332E are formed so as to be T-shaped together with the conductor portion 361 and the conductor portion 362. The conductor portion 361 is a rectangular base formed so as to intersect (be orthogonal to) the imaginary line L. The conductor portion 362 is a rectangular protrusion formed so as to be connected to the conductor portion 361 and so as to extend from the conductor portion 361 along the imaginary line L in a direction away from the center point $P_1$.

In the fourth embodiment, the dummy lands 332E are formed so as to be T-shaped, and thus, the conductor portion 361 has a side 363 formed on the center point $P_1$ side. The side 363 is a side formed on the center point $P_1$ side with respect to a center of the dummy land 332E. The dummy land 332E is formed so that a width of the dummy land 332E in a direction intersecting (orthogonal to) the imaginary line L is the largest at the side 363 and becomes smaller in the direction away from the center point $P_1$. Specifically, the insulating member 350 has a lower wettability with the solder than the dummy lands 332E has, and thus, the molten solder tends to collect on the dummy lands 332E and tends to collect on portions of the dummy lands 332E which have a large width. Therefore, the molten solder tends to have a larger height as the dummy land 332E thereunder has a larger width. It follows that the solder collects nearer to the side 363, and, even if the solder is pressed to be flattened in the direction toward the periphery, an amount of the solder which protrudes toward the periphery is reduced. Therefore, a solder bridge is less liable to occur.

The electrode lands 331 are in the shape of a circle having a diameter of, for example, 1.0 [mm]. The dummy lands 332E are T-shaped and have outer dimensions of, for example, 1.0 [mm]×1.0 [mm]. The conductor portions 361 and 362 are sized to be 0.3 [mm]×1.0 [mm]. The conductor portion 362 is formed from the center of the conductor portion 361 so as to be orthogonal to the conductor portion 361. The dummy lands 332E are arranged in, for example, four rows and four columns (sixteen dummy lands 332E in total) inside the region in which the electrode lands 331 are arranged. The dummy lands 332E are arranged along the imaginary lines L which connect the center point $P_1$ of the dummy land group 342E (point opposed to the center point $P_o$ of the interposer 201) and center points of each of the dummy lands 332E with respect to the outer shape thereof so that an apex of each of the conductor portions 362 matches the imaginary lines L.

A distance between the electrode lands 331 and the dummy lands 332E may be the same as a distance between adjacent electrode lands 331, and, in the fourth embodiment, is 0.5 [mm] which is the same as the distance between adjacent electrode lands 331.

The dummy solder 402 (see FIG. 1B) joined to the dummy lands 332E may have a volume which is the same as that of the electrode solder 401 (see FIG. 1B) and may have a different volume as necessary. As a method of supplying the dummy solder 402, similarly to the case of the first embodiment described above, solder paste is printed. In the fourth embodiment, both a diameter of an opening in the printing plate for the electrode land 331 and a diameter of an opening in the printing plate for the dummy land 332E are 1.0 [mm] so that the same volume can be obtained.

In the fourth embodiment, similarly to the cases of the first to third embodiments described above, the dummy lands 332E are arranged at portions opposed to a center of the interposer 201. Therefore, similarly to the cases of the first to third embodiments described above, even if the vertical gap between the interposer 201 and the printed wiring board 301E at the center becomes smaller due to the warpage of the interposer 201 and the printed wiring board 301E, protrusion of the dummy solder 402 can be effectively inhibited. In other words, when the solder is heated and molten, even if the warpage described above in the first embodiment occurs in the interposer 201 and the printed wiring board 301E, the dummy solder 402 is less liable to be flattened.

Further, in the fourth embodiment, the dummy lands 332E are formed so as to be T-shaped, and thus, compared with a case in which lands in the shape of a circle are used, occurrence of a solder bridge can be reduced. Therefore, as the semiconductor package 200, a large-sized semiconductor package in which the influence of the warpage is considerable can be used.

Further, when a small-sized semiconductor package is used to carry out LGA mounting, the amount of the solder to be used can be reduced, and thus, the lands can be arranged at a reduced pitch. Therefore, a mounting structure which is advantageous for a trend toward multi-pin can be obtained. Further, the dummy solder 402 is less liable to protrude, and thus, a distance between the electrode lands 331 and the dummy lands 332E may not be secured more than necessary, which enables increase in the number of the electrode lands 331 or the dummy lands 332E to be arranged.

When the extent of the protrusion of the dummy solder 402 is large due to the influence of the warpage of the interposer 201 or the printed wiring board 301E, the distance between an electrode land 331 and a dummy land 332E is caused to be larger than the distance between adjacent electrode lands 331, which can prevent a bridge.

Further, by forming the dummy lands 332E to be T-shaped, even when the distance therebetween is the same as that when the dummy lands are in the shape of a circle, an area occupied by the dummy lands can be reduced. This enables, when the same amount of the solder paste as that for the electrode lands 331 is supplied, the dummy solder to be formed is higher. This can further increase the distance between the interposer 201 and the printed wiring board 301E, which can further reduce occurrence of a solder bridge. Further, even if a substrate having a large amount of warpage is used, LGA mounting can be carried out with a high yield. Thus, costs can be reduced.

Figure 6A:
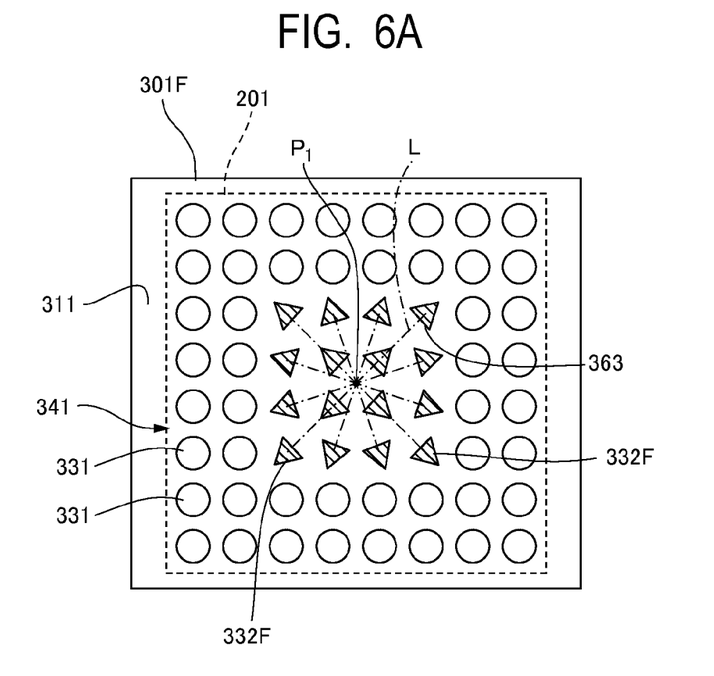
FIGS. 6A and 6B are plan views illustrating modifications of the printed wiring board of the printed circuit board according to the fourth embodiment.
Figure 6B:
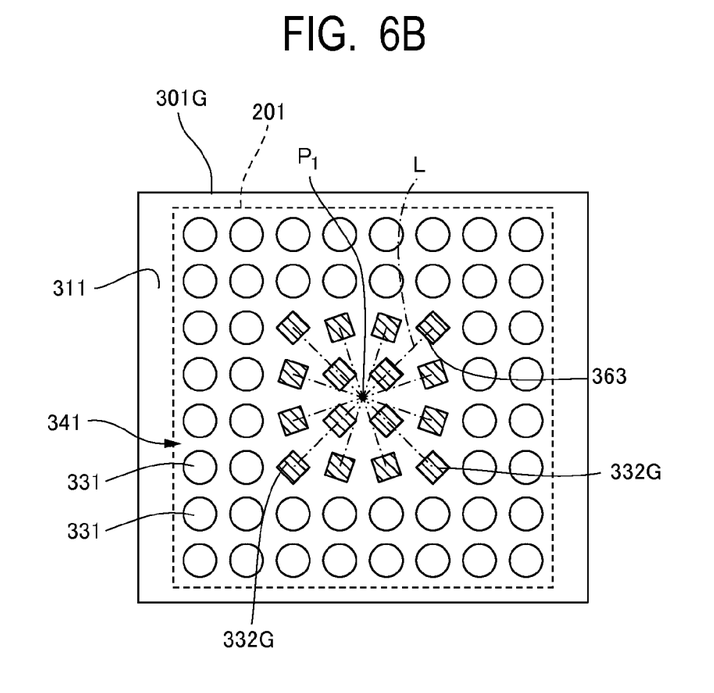

FIGS. 6A and 6B are plan views illustrating modifications of the printed wiring board according to the fourth embodiment. FIG. 6A and FIG. 6B illustrate printed wiring boards 301F and 301G, respectively, as separate modifications. Note that, the semiconductor device has a similar structure as that in the case of the first embodiment described above. FIGS. 6A and 6B illustrate exemplary dummy lands which have the side 363 on the center point $P_1$ side, similarly to the case of the printed wiring board 301E illustrated in FIG. 5. The dummy lands are formed in the shape of a polygon with the side 363 being a side thereof. The polygon is a triangle in FIG. 6A and is a rectangle in FIG. 6B as examples.

The side 363 of the dummy lands 332F and 332G causes the molten solder to be more liable to be attracted to the side 363 due to surface tension, and thus, a solder bridge can be effectively prevented.

Further, by forming the dummy lands 332F and 332G in the shape of, among polygons, a triangle or a rectangle, the widths of the dummy lands 332F and 332G become smaller or remain the same from the side 363 in the radial direction (direction toward the periphery). Therefore, compared with a case in which the widths become larger, the molten solder can be attracted toward the side 363 more effectively, and a solder bridge can be effectively prevented. In particular, the dummy lands 332F are in the shape of a triangle, and thus, the width thereof becomes smaller from the side 363 in the radial direction (direction toward the periphery). Therefore, the molten solder can be attracted toward the side 363 more effectively, and a solder bridge can be prevented more effectively.

Fifth Embodiment

Figure 7:
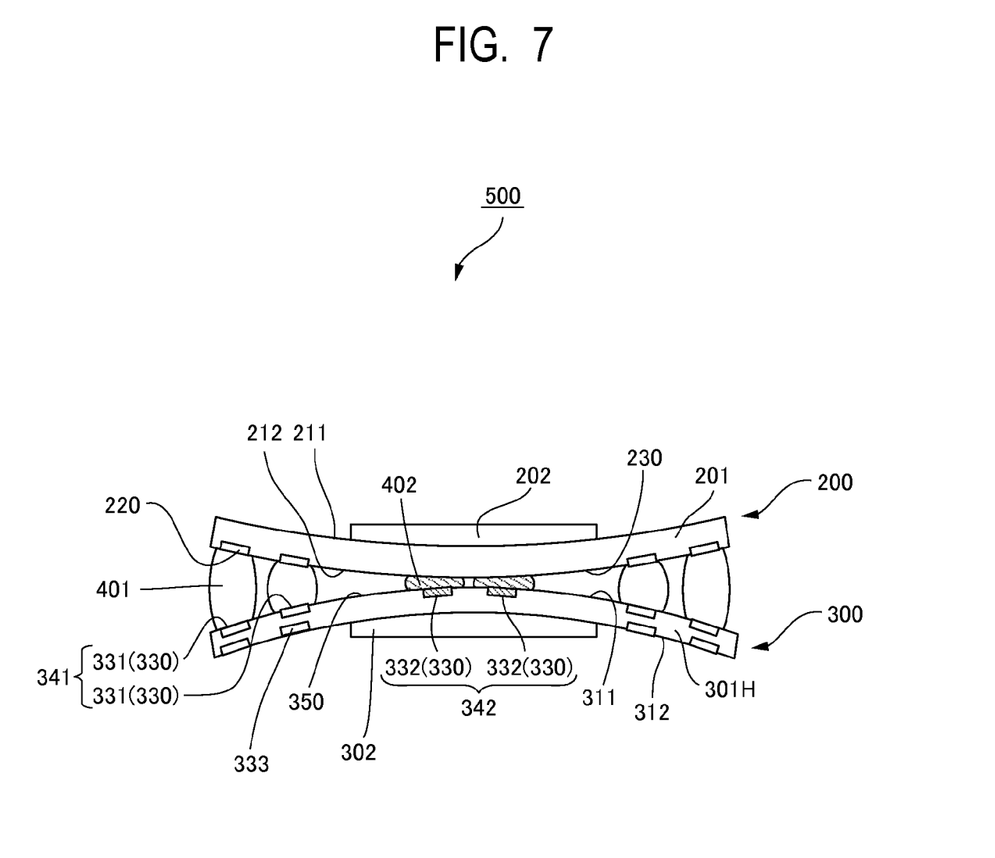
FIG. 7 is a sectional view illustrating a stacked semiconductor device according to a fifth embodiment of the present invention.

Next, a stacked semiconductor device according to a fifth embodiment of the present invention is described. FIG. 7 is a sectional view illustrating the stacked semiconductor device according to the fifth embodiment of the present invention. In the first to fourth embodiments described above, printed circuit boards in which a semiconductor device is mounted on a printed wiring board (motherboard) are described. In the fifth embodiment, a case is described in which another semiconductor element is mounted on a printed wiring board of a printed circuit board and the printed wiring board and the another semiconductor element form another semiconductor device. Specifically, a stacked semiconductor device formed by stacking the semiconductor device and the another semiconductor device is described.

A stacked semiconductor device 500 includes the semiconductor package 200 as a first semiconductor device having the same structure as that in the first embodiment described above, and a semiconductor package 300 as a second semiconductor device which is different from the semiconductor package 200. The stacked semiconductor device 500 is formed by stacking those semiconductor packages 200 and 300 in a stacking direction.

The semiconductor package 300 includes, as an interposer other than the interposer (first interposer) 201, an interposer (second interposer) 301H which is a printed wiring board, and a semiconductor element (second semiconductor element) 302 other than the semiconductor element (first semiconductor element) 202. The semiconductor element 302 is mounted on a surface 312 of the interposer 301H on a side opposite to the surface 311 (surface opposed to the surface 212 of the interposer 201). Therefore, in the interposer 301H, similarly to the case of the semiconductor package 200, warpage occurs under a state in which the surface 311 on a side opposite to the surface having the semiconductor element 302 mounted thereon bulges, that is, the interposer 301H bulges upward. Note that, lands 333 to be joined to lands of another substrate via solder are formed on the surface 312 of the interposer 301H.

In the fifth embodiment, similarly to the case of the first embodiment described above, the plurality of lands 330 are formed on the interposer 301H. The plurality of lands 330 include, similarly to the case of the first embodiment described above, the electrode land group 341 formed of the plurality of electrode lands 331 and the dummy land group 342 formed of the plurality of dummy lands 332. The electrode solder 401 is joined to the electrode lands 331 and the lands 220 to electrically connect the electrode lands 331 and the lands 220, respectively. The dummy solder 402 is joined to the dummy lands 332, but is not joined to the lands 220. Similarly to the case of the first embodiment described above, the dummy solder 402 is brought into contact with a predetermined region on the surface 212 of the interposer 201 on an inner side of the regions in which the plurality of lands 220 are arranged, to thereby maintain a gap between the interposers 201 and 301H.

According to the fifth embodiment, similarly to the case of the first embodiment described above, a bridge between the dummy solder 402 and the electrode solder 401 and a bridge in the electrode solders 401 can be prevented.

EXAMPLE

Figure 8A:
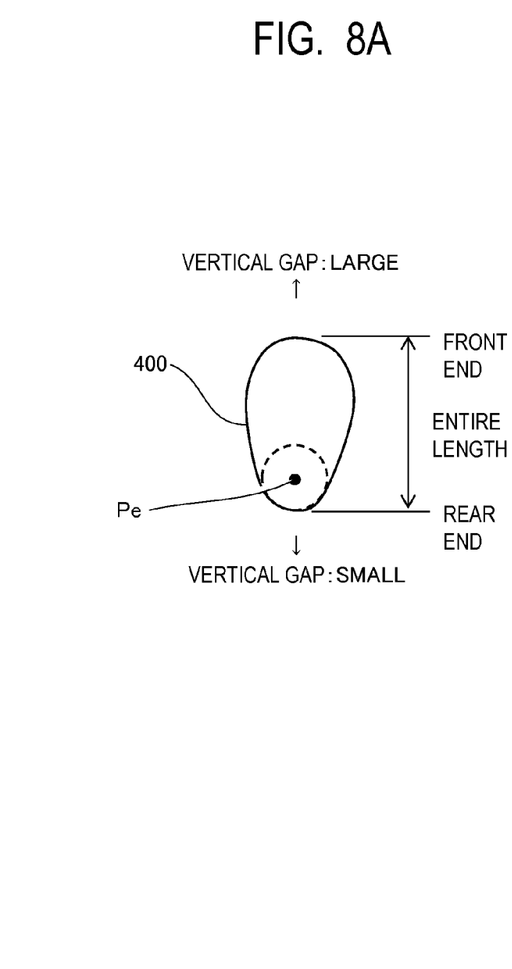
FIGS. 8A and 8B show results of an experiment on an amount of spread of solder with regard to various shapes of a dummy land.
Figure 8B:
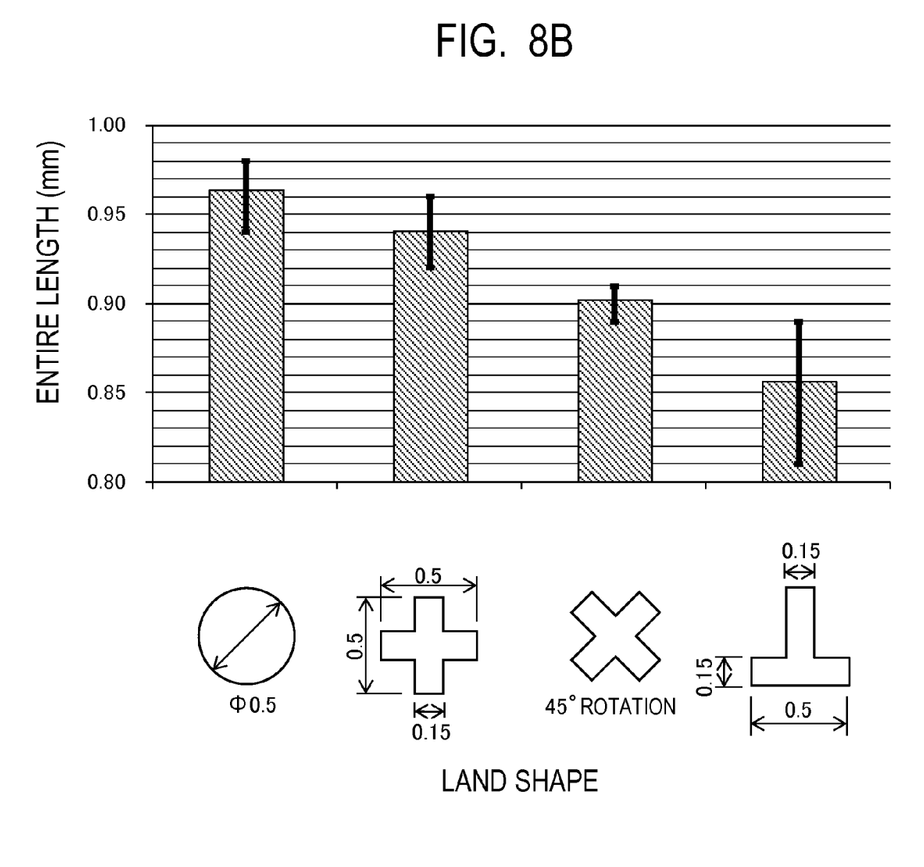

Next, FIGS. 8A and 8B show results of an experiment on an amount of spread of solder with regard to various shapes of a dummy land. FIG. 8A illustrates a measurement method, and FIG. 8B is a graph showing the results of the measurement.

In this experiment, a case was assumed in which warpage of the semiconductor package and the printed wiring board caused a level difference of 200 [μm] between the center and an end portion in a region in which a package having a width of 32 [mm] was mounted. This case was simply modeled as a case in which the solder was pressed to be flattened from above with a tilt angle of about 0.7[°], between the interposer and the printed wiring board.

As the substrate assumed to be the printed wiring board, an organic substrate formed of a glass epoxy material was used. Lands in the shape of a cross and in the shape of the letter T formed by combining two rectangles each sized to be 0.5 [mm]×0.15 [mm] were provided on the substrate. Further, a land in the shape of a circle having a diameter of 0.5 [mm] was formed.

No solder resist was provided on the lands, and the contours of the lands were formed only by etching of Cu foil. The wettability of the substrate with the molten solder is extremely low similarly to that of the solder resist, and thus, influence thereof on this result is not considered.

A glass plate assumed to be the interposer was fixed above the substrate with one end thereof being a fulcrum, and a spacer having a thickness of 0.1 [mm] was provided on the substrate at a distance of 8 [mm] from the fulcrum. The spacer was used so that the glass plate stopped at a height of 0.1 [mm] when the glass plate was pressed and so that the tilt angle between the glass plate and the substrate was constant.

Note that, in order that the solder when the glass plate was pressed thereagainst had a height of about 60 [μm], the fulcrum of the glass plate was fixed at a portion which was at a distance of 5 [mm] from a center Pe of outer dimensions of the land.

A solder ball having a melting point of 140[° C.] and having a diameter of 0.4 [mm] was in advance heated and molten on each land.

Samples prepared as described above were used. After the solder was heated and molten, the glass plate was pressed against the solder from above, and, under the state in which the solder was flattened, the solder was cooled and solidified. With regard to a method of the heating, a hot plate was used, and the temperature was set at 200[° C.].

The glass plate was pressed against the solder after the solder was molten and the substrate was moved onto an aluminum plate for cooling, and before the solder was solidified. After that, as illustrated in FIG. 8A, an entire length from a front end to a rear end of solidified solder 400 was measured using an optical microscope, and comparison was made.

As shown in FIG. 8B, when the land was in the shape of a circle, the entire length of the solder was 0.96 [mm] on average. When the land was in the shape of a cross, the entire length of the solder was 0.94 [mm] on average. From the results of this experiment, it was confirmed that the entire length of the solder was smaller in the case of the land in the shape of a cross compared with the case of the land in the shape of a circle. Therefore, it was shown that, as described above in the second embodiment, the effect of inhibiting the amount of protrusion of the solder was enhanced in the case of the dummy lands 332A in the shape of a cross compared with those in the shape of a circle.

Further, with regard to the case of the land 332B of the third embodiment described above in which the land 332A in the shape of a cross was rotated by 45° with respect to a direction of protrusion of the solder, the entire length of the solder was 0.90 [mm] on average, and it was found that the entire length of the solder was further reduced. From the result, it was made clear that the effect of inhibiting the amount of spread was enhanced compared with the case in which the land was not rotated with respect to the direction of protrusion of the solder.

Further, with regard to the case of the T-shaped land 332E described in the fourth embodiment, the entire length of the solder was 0.86 [mm] on average, and it was shown that the entire length was smaller than those of all the other land shapes.

The reasons that the effect described above was able to be obtained are thought to be as follows. First, when the solder is pressed to be flattened under a state in which the substrate and the glass plate are not in parallel with each other, the land is wet with solder with stability around the surface of the land. On the other hand, the solder above and away from the surface of the land is in a state of being able to freely flow within the surface of the land.

When the land is in the shape of a cross or in the shape of the letter T, the solder pressed to be flattened is in a state of being in contact with both the surface of the land and the surface of the substrate. Therefore, at the surface of the substrate which has a low wettability with molten solder, force to forcing back the solder which attempts to protrude acts simultaneously. As a result, the solder is liable to spread in a direction orthogonal to the direction of protrusion, and thus, the entire length of the solder in the direction of protrusion is reduced. In particular, when the land is T-shaped, the land is provided so that the width thereof in the direction intersecting (orthogonal to) the imaginary line L becomes smaller in the direction toward the periphery, and thus, the solder tends to collect near the side 363 which is closer to the center point $P_1$. Therefore, protrusion of the solder along the imaginary line L toward the periphery can be inhibited.

As another reason, the solder is tied to the land due to the wettability, and thus, even if the solder is pressed to be flattened, the solder does not depart from the land, and attempts to spread from an end portion of the land as a starting point that is positioned opposite to the direction of protrusion. Therefore, as a width of the starting point of the spread in a direction orthogonal to the direction of protrusion becomes larger, more volume of the solder can be caused to remain on a side opposite to the direction of protrusion. With regard to the land in the shape of a cross which is rotated by 45° and the inverted T-shaped land viewed from the center of the dummy land group, the width of the starting point is large at the rearmost portion of the land with respect to the direction of protrusion, and thus, the effect is thought to be more enhanced.

From the reasons described above, it is not necessary that the land in the shape of a cross and the T-shaped land are not required to have a corner formed therein. A substantially cross-shaped or substantially T-shaped land formed by combination of curved lines can obtain a similar effect.

Further, when the T-shaped land is used, it is more preferred that the portion having the largest width be on an opposite side with respect to the direction of protrusion of the solder, but it is not necessarily required to provide the land strictly in such a way in order to obtain an effect greater than that of the land in the shape of a circle. For example, when the base of the T-shaped land is sized to be 0.3 [mm]×1.0 [mm], even if the land is rotated within a range of ±16[°] with reference to the center point of the outer dimensions of the T-shaped land, an effect greater than that of the land in the shape of a circle can be expected. The result described above is a result of evaluation in cases in which a single land is provided, but a similar effect is thought to be obtained when a plurality of such lands are provided as dummy lands on the printed wiring board.

Further, by providing a plurality of lands in the shape of a cross or in the shape of the letter T under a state in which the directions of the lands are changed in accordance with directions along which the vertical gap between the interposer and the printed wiring board increases, the effect of inhibiting protrusion of the dummy solder can be further enhanced, and occurrence of a bridge can be reduced with more reliability.

Note that, the present invention is not limited to the embodiments described above, and various modifications can be made within the technical idea of the present invention.

In the first to fourth embodiments described above, the dummy lands 332 to 332G are formed on the printed wiring board, and the insulating member 230 is formed on a portion of the interposer 201 which is opposed to the dummy lands, but a reverse structure may be adopted. Specifically, the dummy lands may be formed on the interposer 201, the insulating member 350 on the printed wiring board may be opposed to the dummy lands, and the dummy solder may be connected to (brought into contact with) the insulating member 350.

At that time, a portion corresponding to the predetermined region R having the center at the center point $P_o$ of the surface 212 of the interposer 201 is, in the embodiments described above, the region of the printed wiring board opposed to the predetermined region R. On the other hand, in this case, such portion is the predetermined region R of the surface 212 of the interposer 201 itself. Specifically, in this case, the dummy lands forming the dummy land group are arranged in the predetermined region R having the center at the center point $P_o$ of the interposer 201.

Further, in this case, the insulating member 350 is a solder resist, and thus, in the printed wiring board, a surface level of the solder resist is higher than a surface level of the lands. Therefore, the dummy solder is brought into contact with the insulating member 350 at a portion higher than the lands formed on the printed wiring board by a thickness of the solder resist, which brings about an effect of further increasing the distance between the interposer and the printed wiring board.

Still further, in the first embodiment described above, a case in which the distance between an electrode land 331 and a dummy land 332 is larger than the distance between electrode lands 331 is described, but the distances may be the same.

Further, in the second to fourth embodiments described above, by causing the distance between an electrode land and a dummy land to be larger than the distance between electrode lands, a solder bridge can be prevented more effectively.

Further, in the fifth embodiment, a case is described in which the interposer 301H has a structure substantially the same as that of the printed wiring board 301 of the first embodiment described above, that is, the shape and the arrangement of the dummy lands on the interposer 301H are similar to those in the first embodiment described above, but the present invention is not limited thereto. The shape and the arrangement of the dummy lands on the interposer 301H may be similar to those in the second to fourth embodiments described above.

Further, in the first to fifth embodiments described above, a case is described in which the semiconductor package is of an LGA type, but the present invention is not limited thereto, and is applicable to a case in which the semiconductor package is of a BGA type. Note that, in the case of a mounting structure of an LGA type semiconductor package, the distance between the substrates is smaller than that in the case of a mounting structure of a BGA type semiconductor package and a bridge is more liable to occur. Thus, by applying the present invention, such a bridge can be effectively prevented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-008422, filed Jan. 21, 2014, which is hereby incorporated by reference herein in its entirety.

What is claimed is:

1. A printed circuit board, comprising:
   a semiconductor device comprising a semiconductor element and an interposer, the interposer having the semiconductor element mounted on one surface thereof and having a plurality of conductive lands, which are exposed from an insulating member, formed on another surface thereof; and
   a printed wiring board having a plurality of conductive lands, which are exposed from an insulating member, formed on a surface thereof which is opposed to the another surface of the interposer,
   wherein the plurality of lands formed on one of the interposer and the printed wiring board comprise a first land group and a second land group, the first land group having solder formed thereon, the solder being connected to the plurality of lands formed on another surface of the interposer and the printed wiring board, the second land group having solder formed thereon, the solder being in contact with the insulating member of the another surface of the interposer and the printed wiring board,
   wherein the plurality of lands forming the second land group are only arranged in one of a center region of the another surface of the interposer and a region opposed to the center region, wherein the plurality of lands forming the first land group are only arranged around the second land group so as to surround the second land group, and wherein a distance D1 between the lands forming the first land group and the lands forming the second land group is larger than a distance D2 between the lands mutually forming the first land group.

2. A printed circuit board according to claim 1, wherein a distance between the land forming the first land group and the land forming the second land group is larger than a distance between the plurality of lands forming the first land group.

3. A printed circuit board according to claim 2, wherein a smallest gap between the interposer and the printed wiring board is smaller than 300 μm.

4. A printed circuit board according to claim 2, wherein at least an outermost land of the plurality of lands forming the second land group has a side which intersects an imaginary line radially extending from a center point of the second land group and which is formed on the center point side of the second land group.

5. A printed circuit board according to claim 4, wherein the at least the outermost land is formed into a T-shape with a rectangular base which has the side and which extends in a direction intersecting the imaginary line and a protrusion which is connected to the base and which extends along the imaginary line.

6. A printed circuit board according to claim 4, wherein the at least the outermost land is formed into a polygonal shape with the side being a side thereof.

7. A printed circuit board according to claim 6, wherein the polygonal shape comprises one of a triangle and a rectangle.

8. A printed circuit board according to claim 2, wherein the land forming the second land group is formed into a circular shape.

9. A printed circuit board according to claim 2, wherein at least an outermost land of the plurality of lands forming the second land group comprises a first conductor portion having a rectangular shape and a second conductor portion having a rectangular shape which intersects the first conductor portion.

10. A printed circuit board according to claim 9, wherein at least one of the first conductor portion or the second conductor portion extends in a direction intersecting an imaginary line which radially extends from a center point of the second land group.

11. A printed circuit board according to claim 10, wherein an angle between the first conductor portion and the imaginary line and an angle between the second conductor portion and the imaginary line are substantially 45°.

12. A printed circuit board according to claim 9, wherein the first conductor portion and the second conductor portion extend in directions intersecting an imaginary line which radially extends from a center point of the second land group.

13. A printed circuit board according to claim 12, wherein an angle between the first conductor portion and the imaginary line and an angle between the second conductor portion and the imaginary line are substantially 45°.

14. A printed circuit board according to claim 9, wherein the at least the outermost land is formed into a cross shape with the first conductor portion and the second conductor portion.

15. A printed circuit board according to claim 9, wherein the at least the outermost land is formed into a V-shape with the first conductor portion and the second conductor portion.

* * * * *